US 6,596,138 B2

(12) United States Patent
Shibasaki

(10) Patent No.: US 6,596,138 B2
(45) Date of Patent: Jul. 22, 2003

(54) SPUTTERING APPARATUS

(75) Inventor: Masao Shibasaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/051,114

(22) Filed: Jan. 22, 2002

(65) Prior Publication Data

US 2002/0104756 A1 Aug. 8, 2002

(30) Foreign Application Priority Data

Jan. 26, 2001 (JP) ........................................... 2001-19039

(51) Int. Cl.[7] .............................................. C23C 14/34
(52) U.S. Cl. .............................. 204/298.02; 204/298.11
(58) Field of Search ........................ 204/298.11, 298.02

(56) References Cited

U.S. PATENT DOCUMENTS

2002/0187271 A1 * 12/2002 Demaray et al. ........... 427/402

FOREIGN PATENT DOCUMENTS

JP           2000-67432      * 3/2000  ............ G11B/5/85

* cited by examiner

Primary Examiner—Steven H. VerSteeg
(74) Attorney, Agent, or Firm—Oliff & Berridge, PLC

(57) ABSTRACT

A sputtering apparatus having a target jig that can suppress abnormal discharges such as micro-arcs is provided. A magnetron sputtering apparatus having a vacuum container in which a retaining section (an anode side) for retaining a wafer WF, a shutter, and a target (a cathode side) are provided. There are provided a backing plate (a copper plate for cooling) connected to the target and a copper plate (connected to an electrode) which contains magnets and conducts cooling water. An earth shield is provided around the target, to be separated from the electrode on the target side. A gap between a target jig and a projected portion of the earth shield is the narrowest, and surfaces of the target jig and the projected portion of the earth shield are finished into mirror surfaces.

3 Claims, 2 Drawing Sheets

SPUTTERING APPARATUS

Japanese Patent Application No. 2001-19039, filed Jan. 26, 2001, is hereby incorporated by reference in its entirety.

BACKGROUND OF THE INVENTION

The present invention relates to manufacture of semiconductor devices, and more particularly to an improvement of a target jig in a sputtering apparatus that is used to form thin films of semiconductor integrated circuits.

When gas for discharge such as argon is injected in a vacuum space and a voltage is applied to an electrode, a glow discharge (plasma) is generated. In this instance, ions in the plasma collide with a cathode target and strike out target atoms (i.e., a sputtering phenomenon takes place). A sputtering apparatus uses this sputtering phenomenon to form a thin film on a substrate.

Among the sputtering apparatuses, a magnetron sputtering apparatus that performs sputtering by a magnetron discharge using magnetic fields to increase the plasma density is known. Magnetron sputtering provides an ideal discharge characteristic at a low voltage with a large current, and therefore has a good sputtering efficiency and is capable of forming films at a high speed. Also, since electrons are captured in the vicinity of the target, collision of electrons with a substrate is reduced and an elevation in the temperature of the substrate is suppressed such that films can be formed at low temperatures.

As it is well known, a magnetron sputtering is structured in a manner that a magnet is attached to a back of a target such that a part of lines of magnetic force becomes parallel with a cathode surface. Generally, it is equipped with a backing plate (a copper plate for cooling) that is connected to a target and a copper plate (connected to an electrode) that is provided for enclosing a magnet and conducting cooling water.

It is noted that the target that is connected to the backing plate has a side portion that can be held by a ring-shape jig (a target jig). The target jig is disposed on the backing plate around the target, and also functions as a jig that covers the side portion of the target and the backing plate to prevent particles from adhering thereto. The target jig is formed from stainless steel or aluminum, titanium or the like that hardly affects the sputtering process.

There are cases when an abnormal discharge such as a micro-arc is generated in a narrow gap between the target jig and the vacuum container. As a result, the plasma state not only becomes unstable due to a rapid fall of a discharge voltage near an outer periphery of the target, but also the target material may be removed and cause contamination with particles.

BRIEF SUMMARY OF THE INVENTION

The present invention has been made in view of the circumstances described above, and it is an objective to provide a sputtering apparatus that has a target jig that can suppress abnormal discharges such as micro arcs.

The present invention relates to a sputtering apparatus in which gas for discharge is injected in a vacuum container and a high-frequency glow discharge is generated therein to collide ions in plasma with a cathode target to thereby generate particles to a substrate, the sputtering apparatus comprising a target jig that is provided to hold a side portion of the target, wherein each of surfaces of the target jig and the vacuum container that closely faces each other is finished with mirror.

In the sputtering apparatus in accordance with the present invention, the surfaces of the target jig and the vacuum container that are facing each other are finished with mirror so that the generation of micro-arcs is suppressed.

As a result, this can provide a sputtering apparatus having a target jig that can suppress abnormal discharges such as micro-arcs and achieving generation of stable plasma.

As an uppermost surface layer, a thin oxide film may be coated on the mirror finished surface of the target jig, which is closely facing to the vacuum container. This maintains the mirror surface and protects the surface of the target jig that is exposed to the plasma.

The vacuum container may include a projected portion which protects the target jig from ions in the plasma.

DETAILED DESCRIPTION OF THE EMBODIMENT

Figure 1:
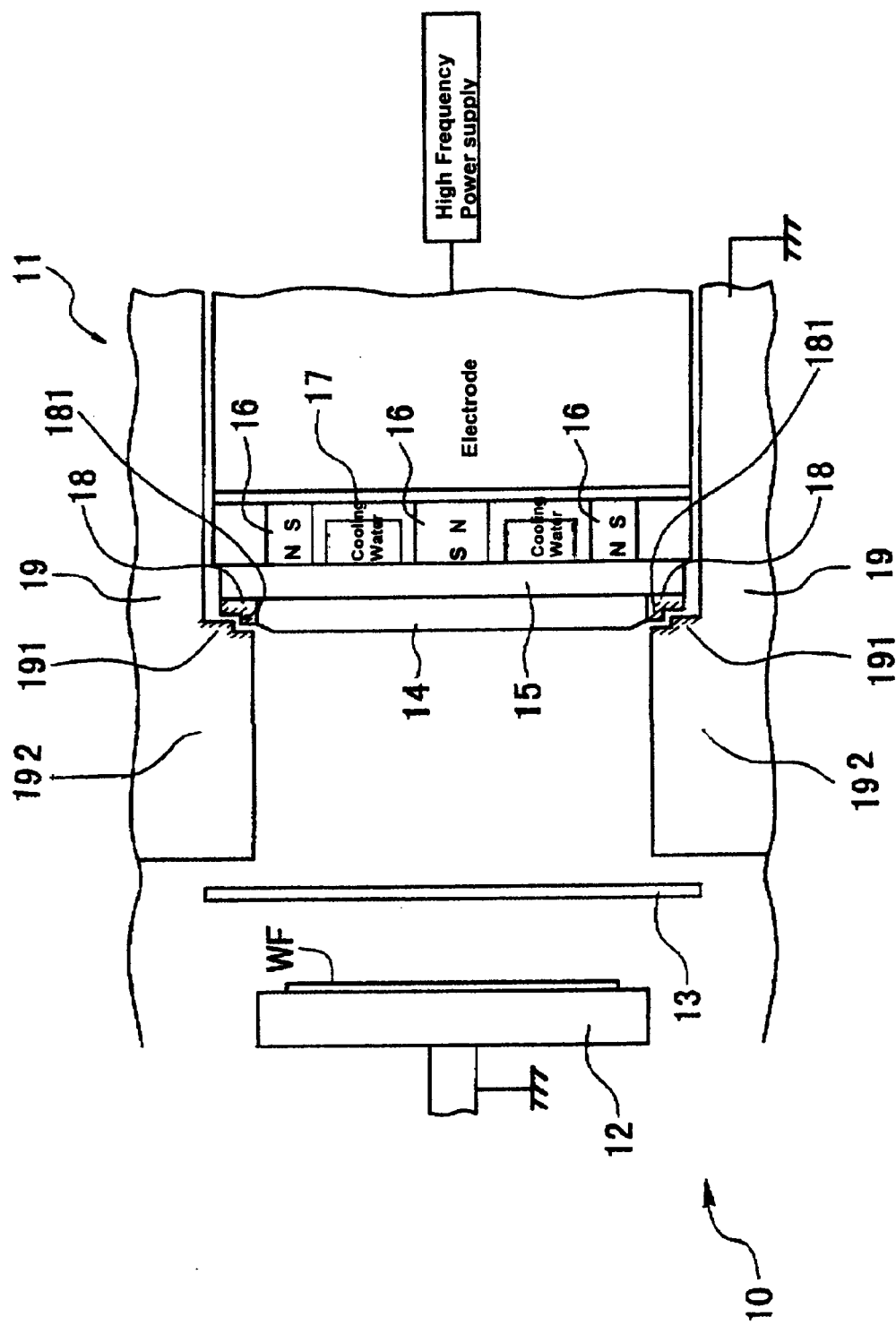
FIG. 1 shows a structure of a main part of a sputtering apparatus in accordance with a first embodiment of the present invention.

FIG. 1 shows a structure of a main part of a sputtering apparatus in accordance with a first embodiment of the present invention. The figure shows a magnetron sputtering apparatus 10 having a vacuum container 11 in which a retainer section (an anode side) 12 for retaining a wafer WF, a shutter 13, and a target (a cathode side) 14 are provided.

Further, there is provided a backing plate (a copper plate for cooling) 15 connected to the target 14 and a copper plate (that is connected to an electrode) 17 which contains magnets 16 and conducts cooling water. An earth shield 19 is provided around the target 14, to be separated from the electrode on the target side. With this structure, a magnetic field that is perpendicular to an electric field between the electrodes on the target 14 and the wafer WF is applied, such that a large amount of ions is generated near the target by a magnetron discharge to thereby accelerate the vapor deposition speed.

In the structure described above, the target jig 18 is disposed on the backing plate 15 around the target in a manner to hold the side portion of the target 14. The target jig 18 also functions as a jig to cover the side portion of the target 14 and the backing plate 15 to prevent particles from adhering thereto.

The earth shield 19 includes a projected portion 192 which protects the target jig from ions in the plasma.

Regarding the earth shield, a gap between the target jig 18 and the projected portion 192 of the earth shield 19, which are facing each other, is the narrowest, and the gap is 2 to 3 mm wide. Accordingly, during the operation of the apparatus, abnormal discharges such as micro-arcs are most likely generated in the gap.

Accordingly, in the present embodiment, the surface of the target jig 18 facing to the projected portion 192 of the earth shield 19 is finished into a mirror surface 181. The mirror surface finish is achieved by, for example, an electrolytic polishing to a surface roughness Ra of about 0.01 to 0.1 $\mu$m. Furthermore, the surface of the projected portion 192 of the earth shield 19, which is closely facing to the target jig 18, is also finished into a similar mirror surface 191.

With the structure described above, abnormal discharges such as micro-arcs at the target jig 18 can be suppressed. As a result, the plasma becomes stable even in the area around an outer periphery of the target, and possibility of inducing particle contamination can be almost eliminated.

Figure 2:
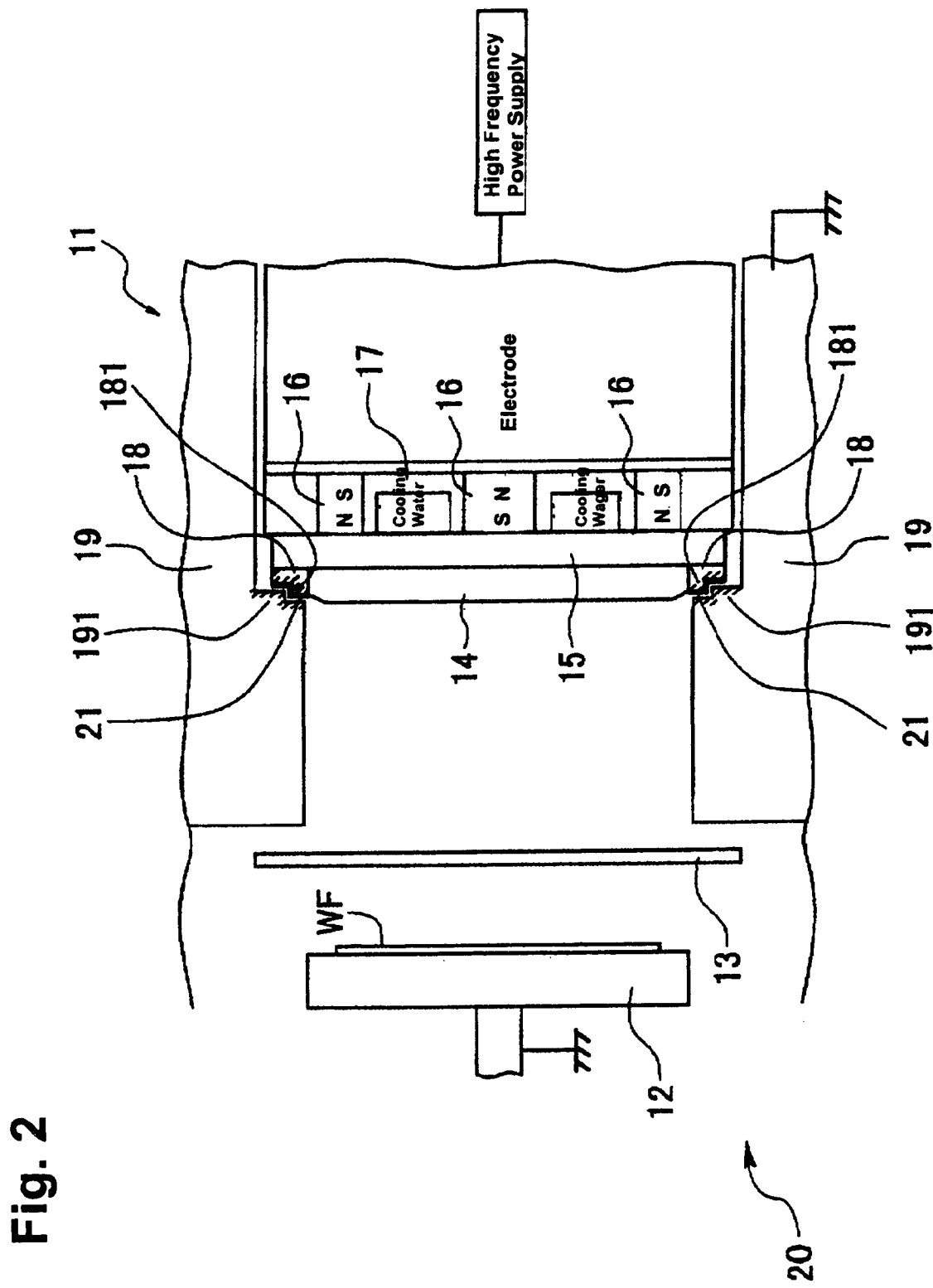
FIG. 2 shows a structure of a main part of a sputtering apparatus in accordance with a second embodiment of the present invention.

FIG. 2 shows a structure of a main part of a sputtering apparatus in accordance with a second embodiment of the present invention. The figure shows a magnetron sputtering apparatus 20. Portions that are similar to those of the structure in accordance with the first embodiment are referred to by the same reference numerals, and their description is omitted.

In the structure of the second embodiment, an extremely thin oxide film 21 at an atom layer level is further coated on the mirror finished surface 181 of the target jig 18, to define an uppermost layer of the mirror finished surface. The extremely thin oxide layer 21 is an atom layer in which 100 to 200 atoms are stacked in layers, which does not grow more than designed, and it is formed by a thermal oxidation, a UV or $O_2$ gas plasma or the like. Other compositions are the same as those of the structure in accordance with the first embodiment.

The structure in accordance with the present embodiment provides effects similar to those obtained by the first embodiment described above, and in addition maintains the mirror surface and protects the surface of the target jig 18 that is exposed to the plasma by the extremely thin oxide film 21. As a result, the plasma becomes stable even in the area around an outer periphery of the target, and possibility of inducing particle contamination can be eliminated.

By the structure in accordance with each of the embodiments described above, abnormal discharges such as micro-arcs around a target can be substantially reduced. As a result, generation of particles can be substantially reduced, and the application of a magnetic field perpendicular to an electric field between electrodes of a target and a wafer can generate a magnetron discharge that generates a stable plasma that forms a large amount of ions in the vicinity of a target.

What is claimed is:

1. A sputtering apparatus in which gas for discharge is injected in a vacuum container and a high-frequency glow discharge is generated therein to collide ions in plasma with a cathode target to thereby generate particles to a substrate, the sputtering apparatus comprising:

a target jig that is provided to hold a side portion of the target, wherein each of surfaces of the target jig and the vacuum container that closely faces each other is finished with mirror.

2. The sputtering apparatus according to claim 1, wherein as an uppermost surface layer, a thin oxide film is coated on the mirror finished surface of the target jig, which is closely facing to the vacuum container.

3. The sputtering apparatus according to claim 1, wherein the vacuum container includes a projected portion which protects the target jig from ions in the plasma.

* * * * *